(12) United States Patent
Boehl et al.

(10) Patent No.: US 7,954,042 B2
(45) Date of Patent: May 31, 2011

(54) CHECK TESTING OF AN ADDRESS DECODER

(75) Inventors: Eberhard Boehl, Reutlingen (DE);
Gunter Seydel, Gomaringen (DE);
Karsten Schmidt-Grethe, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 1241 days.

(21) Appl. No.: 11/499,503

(22) Filed: Aug. 4, 2006

(65) Prior Publication Data
US 2007/0061686 A1 Mar. 15, 2007

(30) Foreign Application Priority Data

Aug. 4, 2005 (DE) .......................... 10 2005 036 728
Jan. 30, 2006 (DE) .......................... 10 2006 004 168

(51) Int. Cl.
*G11C 29/00* (2006.01)
(52) U.S. Cl. ........................................ 714/805; 714/719
(58) Field of Classification Search .................. 714/805, 714/719
See application file for complete search history.

(56) References Cited

U.S. PATENT DOCUMENTS

2006/0077750 A1* 4/2006 Pescatore ...................... 365/232
2006/0156134 A1* 7/2006 Mukherjee et al. ........... 714/733

FOREIGN PATENT DOCUMENTS

| DE | 43 17 175 | 11/1994 |
|---|---|---|
| EP | 1001432 | 5/2000 |

OTHER PUBLICATIONS

Manoj Sachdev "Testing and Testability Techniques for Open Defects in RAM Address Decoders", 1996, IEEE, 7 Pages, ED&TC.

Luigi Dilillo et al., "Comparison of Open and Resistive-Open Defect Test Conditions in SRAM Address Decoders", 2003, IEEE, 6 Pages, Proceedings of the 12th Asian Test Symposium.
Benoit Nadeau-Dostie et al., "Serial Interfacing for Embedded-Memory Testing", 1990, IEEE Design & Test of Computers, pp. 52-63.
Shreekanth Moorthy, "Integrating the CAD Model With Dynamic Simulation: Simulation Data Exchange", 1999, pp. 276-280, Proceedings of the 1999 Winter Simulation Conference.
U. Roegoderer et al., "A Concept for Automatical Layout Generation", 1995, IEEE, pp. 800-805, IEEE International Conference on Robotics and Automation.
Manfred Weck et al., "Abteilungsubergreifendes Projektieren kimplexer Maschinen and Anlagen", Oct. 1995, pp. 54-58, Integrierte Produktion English translation of summary/abstract is provided herewith.
Todd McCall, "IBM and Dassault Systemes Launch CATIA Version 5 Release 6", May 2001, IBM, Online, COE NewsNet, http://www.coe.org/coldfusion/newsnet/may01/technology.cfm.

* cited by examiner

*Primary Examiner* — Sam Rizk
(74) *Attorney, Agent, or Firm* — Kenyon & Kenyon LLP

(57) ABSTRACT

For checking an address decoder of a data memory, from a record of addresses of the data memory, designated as base addresses, one after another each base address is selected, and the following steps are executed for the respectively selected base address:
a) determining the content of the base address; and
b) selecting an address having the Hamming distance 1 from the base address, designated as the Hamming address; and then:
c) changing the content of the Hamming address selected in step b); and then:
d) reading the base address and detecting an error of the address decoder if the content read differs from that determined in step a); and
e) recovering the content of the Hamming address.

31 Claims, 3 Drawing Sheets

CHECK TESTING OF AN ADDRESS DECODER

FIELD OF THE INVENTION

The present invention relates to a method for checking an address decoder of a data storage unit for operativeness, as well as a data carrier which includes the program statements that incorporate the method and that are executable by a program-controlled circuit.

BACKGROUND INFORMATION

Errors in the decoder of an addressable storage module are able to have a devastating effect in applications critical to security if, for instance, as a result of one such error the content of another storage cell than the one that was addressed is output, or if a storage cell is overwritten unintentionally. Therefore, such errors have to be detected as quickly as possible after they appear, in order to stop the application in such a case, or at least to block especially security-critical functions that could be affected by the error.

A self-testing device for a data memory is known from German Published Patent Application No. 43 17 175, which permits detecting a simultaneous access, to two or more storage cells of a data memory, which originates from a malfunction of an assigned address decoder. This customary self-test device is in a position to detect a decoder error immediately at the point in time of its first appearance. However, a disadvantage is that the self-test device, since it accesses selection lines between the address coder and a memory matrix of the data memory, has to be integrated with the decoder and the memory matrix on the same semiconductor substrate. Since the self-test device has circuit components specific to it, it takes up space on the semiconductor substrate, which increases the costs of a data memory that is equipped with a self-test device. This inherent cost disadvantage has as the result that such a data memory is used only in special applications that require a high degree of security. Therefore, it will be manufactured in clearly smaller piece numbers than an otherwise comparable data memory that does not have the self-test device, so that the cost disadvantage of the data memory having the self-test device is clearly greater than would be equivalent to the over-usage of substrate area by the self-test device.

Therefore, there is a need for design approaches which permit checking an address decoder of a data memory, without specialized circuit components being required for it. One known design approach is, in an address decoder of n bit width, to select all $2^n$ different addresses, that are represented by the n address bits, one after another as a base address, to write the value 1 to the base address, and to write the value 0 to all Hamming addresses to this base address, that is, those addresses that differ from the base address by exactly one bit, and to check whether the value of the base address has changed. The disadvantage of this method is that the data content of the checked memory is destroyed after the checking. Such a method is applicable at the start of an application, before relevant data are written into the memory, but then it leads to a startup delay of the application, which is a nuisance. In order to avoid the startup delay, and to detect errors that occur during current application, it would be desirable to carry out a test in real time, while the application is running. However, the above test is only suitable for being carried out in real time if it is known that the content of the data memory is no longer needed, which will only be true in exceptional cases.

Even if additional storage space is available, at which the content of the data memory to be checked can be backed up in the mean time, in order to reproduce it later, it has to be ensured that enough time is available for carrying out the test, because, if the test has to be broken off, to take up the normal operation of the application again, in any case time will be required to reproduce the original content of the data memory, and that is time which is not always available in real time applications.

SUMMARY OF THE INVENTION

A method for checking an address decoder is created by the present invention, which does not require any specialized circuit components in the data memory that is to be checked, and is therefore generally applicable to any type of data memory, and which is interruptible at brief intervals, and is therefore suitable for application in a real time system, in which the time available for carrying out the method is not exactly determinable in advance.

The method according to the present invention is generally based on the idea that, from a record of addresses of the data memory, designated as base addresses, one after another each base address is selected, and the following steps are executed for the respectively selected base addresses:
a) determining the content of the base address;
b) selecting an address having the Hamming distance 1 from the base address, designated as the Hamming address;
c) changing the content of the Hamming address selected in step b);
d) reading the base address and detecting an error of the address decoder if the content read differs from that determined in step a); and
e) recovering the content of the Hamming address.

A decoding error which, when selecting a Hamming address, leads simultaneously to an access to the base address, may be recognized in that, in step d), a change in the content of the base address is determined which should not occur during normal functioning. Since steps a) to e) are executed in sequence for each base address, after the processing of a base address, at least the content of the Hamming addresses is recovered faithful to the original, and, in order to be able to interrupt the method according to the present invention, it requires at most the recovery of the content of the base address if that has been changed by step a) of the determination. As will be explained in detail below, there are embodiments of the present invention in which such changes take place, and others in which one may make do without change.

If both the change of the Hamming address in step c) and its recovery in step e) is able to lead to a change in the content of the base address in the error case, it is expedient to execute step d), of reading the base address and detecting an error, before recovering the content of the Hamming address in step e), and also to undertake an appropriate step f) of reading and error detection after the recovery.

This procedure is particularly expedient if the change in, and the recovery of the content of the Hamming address takes place in each case by inverting. The changing and recovering by inverting is generally expedient since it does not require any backup of the content of the Hamming addresses in another storage space, and, as a result, no such storage space has to be held available, and no time has to be expended for the backup and restore operation of the content of the Hamming addresses.

Steps b) to f) are expediently repeated each for a plurality of Hamming addresses assigned to the base addresses, preferably to the totality of these Hamming addresses.

Instead of inverting, the changing of the content of the Hamming address can also be performed by backing up its original content and overwriting it using a predetermined value, and restoring it by a restoring operation on the backed up value to the Hamming address. Provided this takes place successively for all Hamming addresses which are processed in connection with a base address, only a single storage space for backup is required at all times. This can be made available, perhaps in a time-saving manner in the form of a register of a microprocessor or another program-controlled circuit mentioned by the method according to the present invention.

It may also be expedient to carry out step d) of reading the base address, and perhaps detecting an error, only after step c) of changing the content of the Hamming address has been carried out for a plurality of the Hamming addresses assigned to the base address that is being investigated. For, if in step c) each Hamming address is changed to the same value, a mutilation of the content of the base address that has occurred cannot be undone by changing the content of further Hamming addresses. Therefore, in the extreme case, it is sufficient to carry out step d) for a single time, after step c) has been carried out for all the Hamming addresses to be investigated for a given base address that is to be investigated, in order to detect an error condition of the decoder. In order to recover the original content of these Hamming addresses before the method is ended or an additional base address is checked, these original contents are expediently buffer-stored before the overwriting of step c).

According to a first embodiment of the method, determining the content of the base address in step a) is a simple reading of the base address. That means that the method is in a position to work with any value desired which is included in the base address, before it is processed by the method. However, it is also possible, alternatively, to determine the base address by writing a predefined value to the base address and to restore a previously backed up content of the base address to the base address when steps b) to e) have been carried out for each Hamming address to be investigated for the base address.

The record of the base addresses is able to include all addresses in the address space of the data memory. If the data memory has an address decoder made up of line decoders and column decoders, which respectively process a line part and a column part of an address, it is possible considerably to abbreviate the method by selecting the record of addresses in such a way that every possible value of one of the two parts in the record is represented at least once, preferably exactly once. In other words, the line decoder is able to be checked with the aid of a record whose addresses differ only in the bits of the line part, and the column decoder is able to be checked with the aid of a record whose addresses differ only in the bits of the column part.

DETAILED DESCRIPTION

Figure 1:
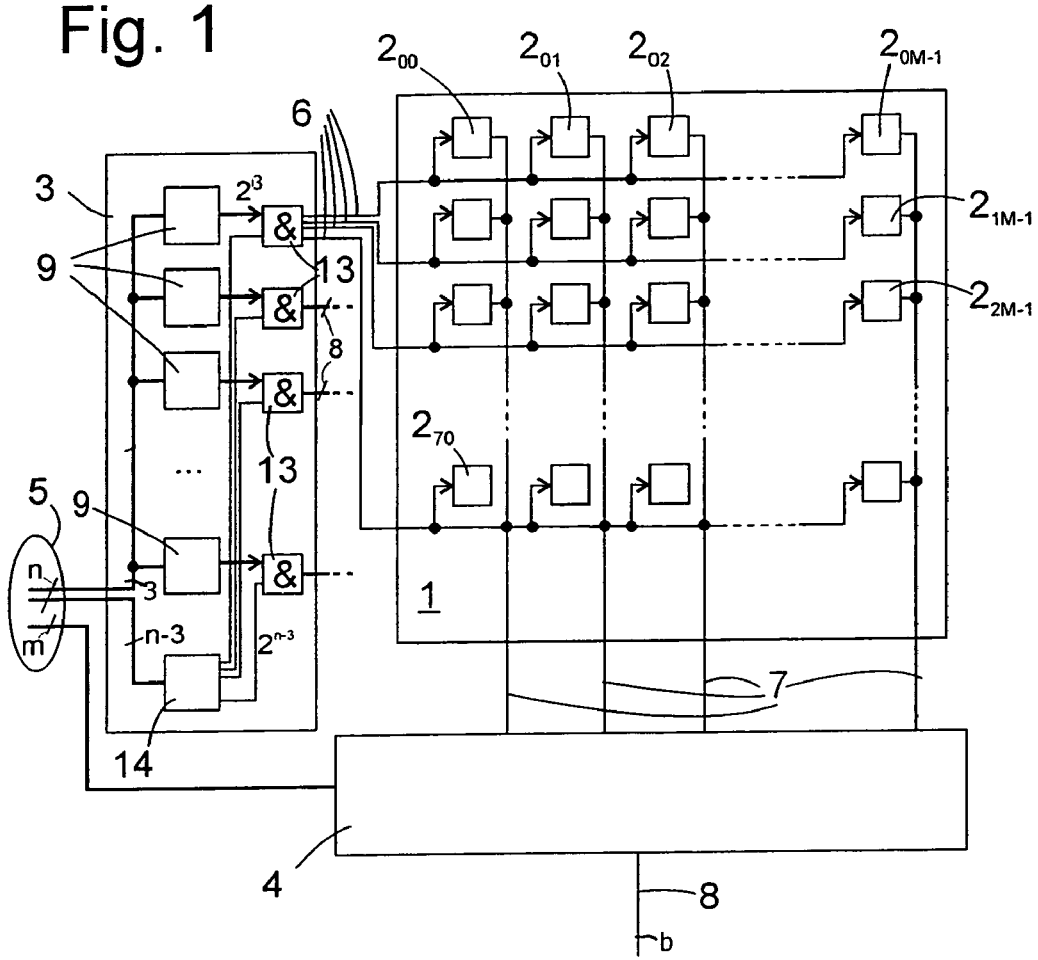
FIG. 1 shows a block diagram of a data memory in which the present invention is able to be used.

The data memory shown in FIG. 1 is known per se, and its description at this point is only intended to simplify the understanding of the checking method according to the present invention that is able to be executed on it.

The data memory shown in FIG. 1 is composed essentially of a storage matrix 1 having $2^{n+m}$ memory locations $2_{ij}$, $i=0, \ldots, 2^{n-1}, j=0, \ldots, 2^{m-1}$, which are situated in $2^n$ lines and $2^m$ columns, and an address decoder composed of a line decoder 3 and a column decoder 4. The address decoder is connected to an address bus 5 having n+m bit width, whose n high-order bits are received by line decoder 3 and whose m low-order bits are received by column decoder 4. Accordingly, the n high-order bits of an address present on address bus 5 are also designated as line part or line address, and the m low-order bits are also designated as column part or column address.

Line decoder 3 has $2^n$ outputs, to which in each case a selection line 6 of storage matrix 1 is connected. When line decoder 3 functions normally, at each write access or read access to data memory 2 it activates a selection line 6, which is assigned to the value of line address i received on address bus 5. In response to a read access to memory location $2n$, all memory locations $2_{i0}, \ldots, 2_{iM-1}$, $M=2^m$ connected to the $i^{th}$ selection line 6 are induced to output their content to one of $2^m$ column lines 7, in each case. Column decoder 4, with the aid of column address b received by it, selects column lines 7 corresponding to the bit width b of data word 8, and connects it bit-wise to the b data input and data output lines 8. In response to a write access, column decoder 4 passes a data value received on data input/data output lines 8 to the b selected column lines 7, and memory locations $2_{ij}$, selected by the $i^{th}$ line, retrieve this data value as new content.

Line decoder 3 is shown in FIG. 1 having an inner structure, which we shall examine briefly below. This explanation is only used to illustrate the error situations that are able to occur in line decoder 3; the checking method according to the present invention is applicable independently of the inner structure of line decoder 3 or column decoder 4.

Figure 2:
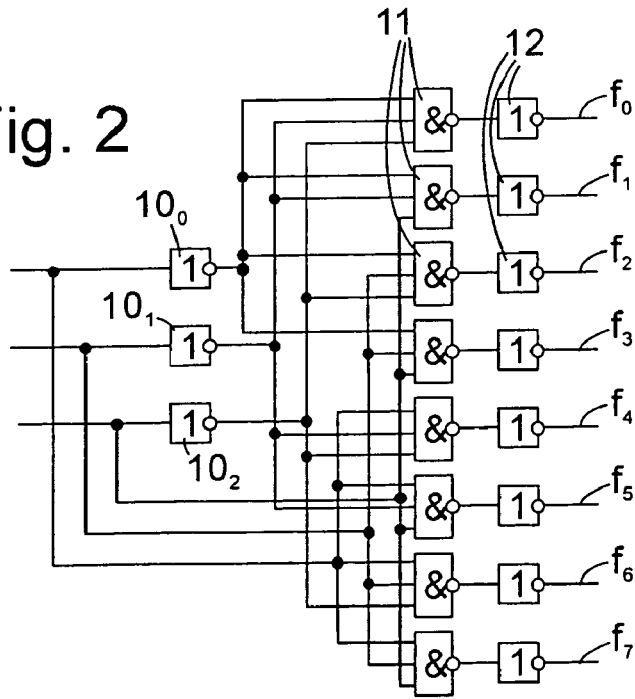
FIG. 2 shows a detail of the data memory from FIG. 1.

Line decoder 3 includes a group of $2^{(n-3)}$-1-of-8 subdecoders 9, which each have a 3-bit wide input and eight output lines, of which, depending on the value of the three bits received at the input, exactly one is active. An exemplary structure of such a subcoder 9 is shown in FIG. 2. It includes three first inverters $10_0, 10_1, 10_2$, of which each inverts one of the three input bits, NAND gate 11 having three inputs, each NAND gate 11 being connected to a different combination of negated or non-negated input bits, and to second inverter 12 that is postconnected to NAND gates 11. Each subdecoder 9 has eight outputs fk, k=0, 1, . . . , 7, the value k of each output corresponding to the binary value of the three input bits by which the respective output is selected.

The eight outputs $f_0, \ldots, f_7$ of each subcoder 9 are connected to a block 13 of eight AND gates having two inputs each, of the two inputs of each gate of block 13, one being connected to one of the eight output lines of subdecoder 9, and another being connected to one of $2^{n-3}$ output lines of a 1-out-of-$2^{n-3}$ subdecoder 14, whose design is analogous to that of subdecoder 9.

An error situation of one of subdecoders 9 may occur, for instance, if the value 1 follows an input value 0 at the input of inverter $10_2$, which value 1, because of an internal circuit board conductor break or the like, a potential corresponding to an earlier output value one remains stored at one place in the inverter, and the output of inverter $10_2$ remains at one, instead of going correctly to zero. The result is that if, for instance, bit values (1, 1, 1) are present at the input of the subdecoder after bit values (1, 1, 0), not only output line $f_7$ but also $f_3$ is selected. Accordingly, two selection lines 6 of storage matrix 1 are activated simultaneously whose addresses differ by one bit. Another possible error case is an error situation in which an output of a NAND gate 11 remains fixed on a logical value or is highly resistive. This too leads to the activation of an additional selection line 6.

Similar errors in one of AND blocks 13 lead to simultaneous activation of two selection lines, or to no selection line at all being activated.

Figure 3:
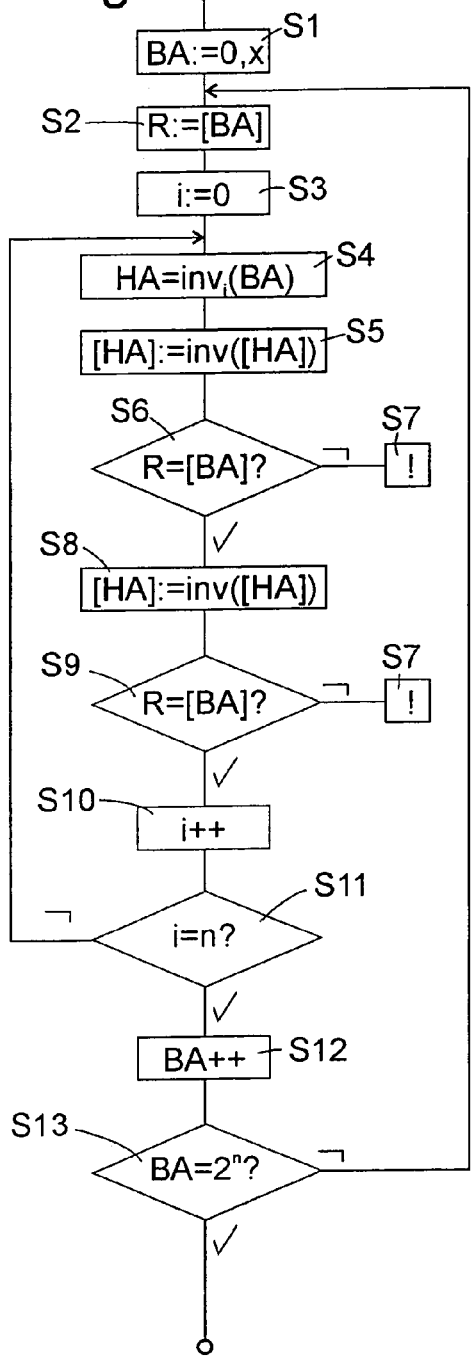
FIGS. 3-6 each show a flowchart of the checking method able to be carried out on the data memory.

FIG. 3 is a flowchart of a first embodiment of the method according to the present invention for checking an address decoder which is able to be applied to the data memory described above. The method is executed by a microprocessor (not shown) or another program-controlled circuit while resorting to program statements that incorporate the method and are stored in a read-only memory. In step S1, a first base address that is to be checked is established. As was described above, an address of the data memory is made up in each case of a line part and a column part of n and m bits, respectively. In this case, let us look at the checking of line decoder 3; in this case, the line part of the address is set to the value 0 and the column part is set to any value x.

Next, the content [BA] of the memory location designated by base address BA is backed up in a register R. In step S3, a counter index i is initialized to 0.

In step S4, a Hamming address HA to base address BA is ascertained:

$$HA=inv_i(BA),$$

where $inv_i$ stands for an operator which inverts the $i^{th}$ bit of its operand and leaves the remaining bits unchanged. The content [HA] of the Hamming address is read in step S5, is inverted bitwise and is stored again at Hamming address HA. If line decoder 3 is working correctly, this has no influence on content [BA] of base address BA. In response to writing in step S5, if the selecting line of base address BA was also activated in error, its content is overwritten by inv([HA]).

In step S6 it is checked whether content [BA] has remained the same as base address BA. If not, there is obviously present an error of line decoder 3, and an error treatment procedure S7 is triggered which, for instance, may be to output a warning message to the notice of a user, or to end an application that is using the checked data memory.

If no change is established in step S6, this may be caused by the circumstance that the value written in step S5 to the Hamming address coincides, by coincidence, with the content of register R. In step S8, content [HA] of Hamming address HA is read again, is inverted, and is restored to the same address. Thereby, the original content of Hamming address HA, which it had before the start of the method, is recovered. In step S6, if the reason for not detecting an error was the coincidental agreement with the value of register R, there can no longer be present such an agreement. It is therefore checked anew in step S9 whether content [BA] of base address BA agrees with register R. If they do not agree, the same error treatment routine S7 is triggered as was described above. If they do agree, counter index i is incremented in step S10, and in step 11 it is checked whether i has reached the value n, that is, whether all n Hamming addresses for base address BA have been checked. If not, the method returns to step S4, in order to generate and to check the next Hamming address; if yes, base address BA is incremented in step S12. Step S13 checks whether all $2^n$ base addresses have been investigated. If not, the method returns to step S2, in order to retrieve the content of new base address BA into register R. If yes, the method is ended and line decoder 3 is recognized as being free of error.

The checking method described above, in each case only modifies the content of a single memory location HA of the data memory to be checked, from step S5 to step S8 As a result, when the method does not just happen to be executing one of steps S5 to S8, it can be interrupted at all times, so that a real time application that wishes to access the data memory, at best has to accept minimum delays until the checking method can be interrupted and it receives access to the data memory.

For checking a single base address BA, the following accesses to the memory are required: a read access in step S2, per Hamming address a read and a write access each in step S5, a read access in S6, a read and a write access in S8 and a read access in S9. The time requirement of these operations may in each case be adopted as a clock pulse. Respectively, an additional clock pulse may be required for the comparison operations in step S6 and S9. Carrying out the checking will then require altogether $2^n \times (1+n \times 7)$ clock pulses. The time required for checking a line decoder having n=10, e.g. in a 128 kB RAM thus amounts to $1.024 \times (1+10 \times 7)=72.704$ clock pulses, which corresponds to a time expenditure of 1.8 ms, at an assumed clock pulse rate of 40 MHz. However, the delay suffered by an application because of the execution of the checking method according to the present invention always amounts to only a few clock pulses, until the next admissible interruption. Even if such an interruption is allowed only after complete checking of a base address, there are $2^n=1.024$ possible interruption points, so that the maximum waiting period is only 1.3 microseconds.

Figure 4:
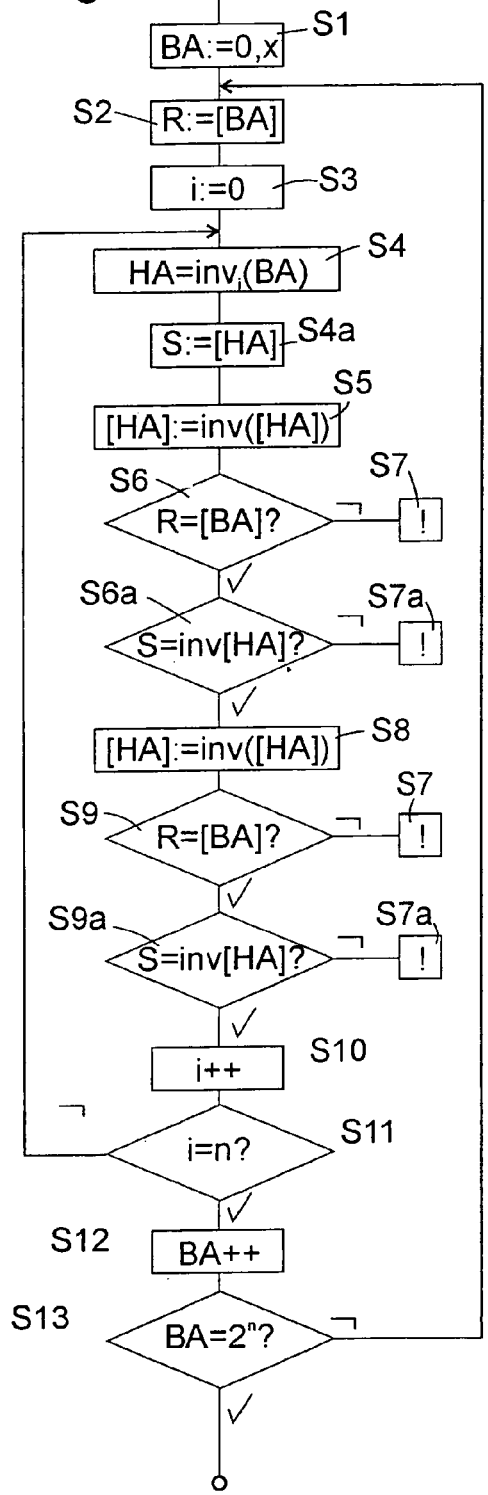

FIG. 4 shows a modification of the method described with reference to FIG. 3, which is particularly expedient for the case in which, in the read branch of the data memory, between memory locations 2 and the output, a buffer storage is present which maintains an output data value while the next piece of data to be output is already being selected in the memory locations. Steps S1 to S4 are the same as in the method of FIG. 3. After S4 there follows a step S4a, in which the content of the current Hamming address HA is backed up in an additional register S. Steps S5 to S7 are again identical to those in FIG. 3. If agreement is determined in step S6 between the content of base address BA and register R, in step S6a there follows a comparison between the inverted content of Hamming address HA and register S. Since the content of Hamming address HA has already once been inverted in S5, agreement is to be expected; if, nevertheless, nonagreement is determined, the reason may be that, to be sure, Hamming address HA was addressed, but, on account of an error in the data memory, the buffer is still outputting the content of base address BA that was read in S6, so that in this case, too, the system branches to an error treatment routine S7a. This may differ from the error treatment routine S7, since the underlying error is able to be a different one from the one detectable in S6. If agreement is determined in S6a, there follow steps S8 of renewed inverting of the content of Hamming address HA and S9 of comparing the content of base address BA to register R. If no error is found in S9, the inverted content of Hamming address HA is once again compared to register S in S9a, and, if there is nonagreement, the system branches to error treatment routine S7a. If there is agreement, there follow steps S10 to S13, again as was described with respect to FIG. 3.

The time required for the method according to FIG. 4, because of the additional read operation, inverting operation and comparison operation of steps S6a, S9a is, to be sure, greater than in the method according to FIG. 3, by at least 4 clock pulses per base address, but in practice this is of no consequence since, for the compatibility of the checking method with an application that is simultaneously accessing the data memory, what is decisive is not the overall duration of the checking, but the maximum waiting time until a possible interruption of the checking.

Figure 5:
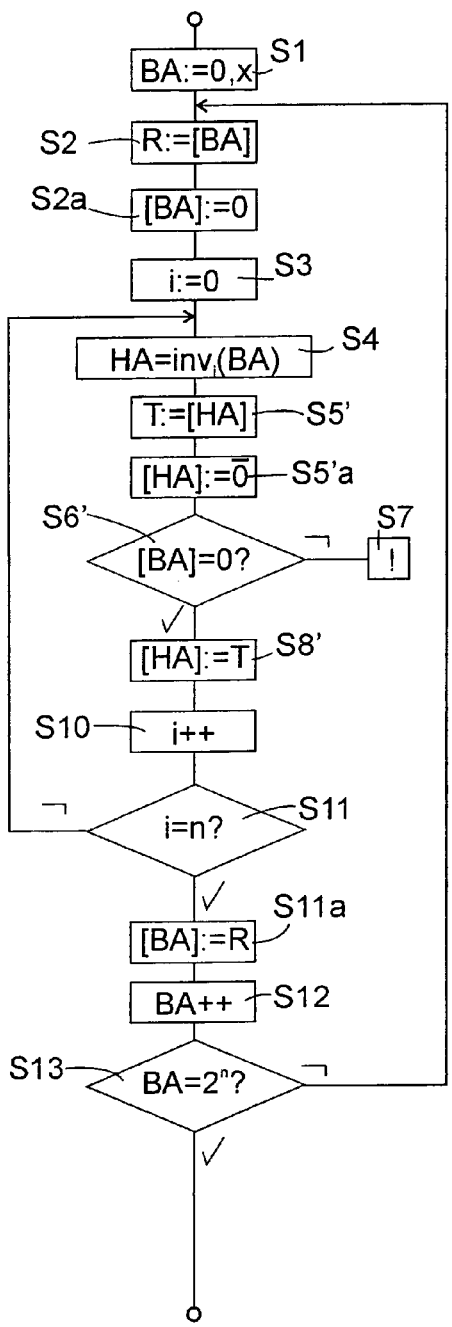

FIG. 5 shows a third embodiment of the checking method. Steps S1 to S4 are the same as in the method of FIG. 3, but between S2 and S3 a step S2a is inserted in which the content of base address BA is set to 0. Instead of inverting content [HA] of the Hamming address as in S5, the content is backed up in a register T (S'5), and then Hamming address HA is overwritten (S'5a) with the logical complement of the value written in step S2a to base address BA, that is, all the bits of the storage location at Hamming address HA are set to 1. In step S6' it is checked whether the content of base address BA has remained equal to 0. If not, there is an error present, and there follows error treatment routine S7. If yes, after step S6' there follows a step S8', in which the content of Hamming address HA is recovered by writing in the value stored in register T. A repeated checking of the content of the base address corresponding to step S9 in FIG. 3 drops out in this case, because it is ensured, by the initialization of the base address to the predefined value 0 in S2a and the setting of the content of Hamming address HA to 1 in S5', that even a single writing to Hamming address HA has to lead to a mutilation at base address BA in case both are activated at the same time.

Steps S10 to S13 are again the same as those described with reference to FIG. 3, between S11 and S12 a step S11a of the restore operation of register R to base address BA being interposed.

Since in this method the content of the base address is in each case changed from step S2a to S11a, the method must not be interrupted between these steps. However, an interruption after checking each base address, subsequent to step S11a, remains possible.

The content of base address BA may also be set to any other value than to 0 in step S2a; since the value written in step S5'a differs in each bit from that written in step S2a, a change caused by the writing process of step S5'a is detected in every case.

Figure 6:
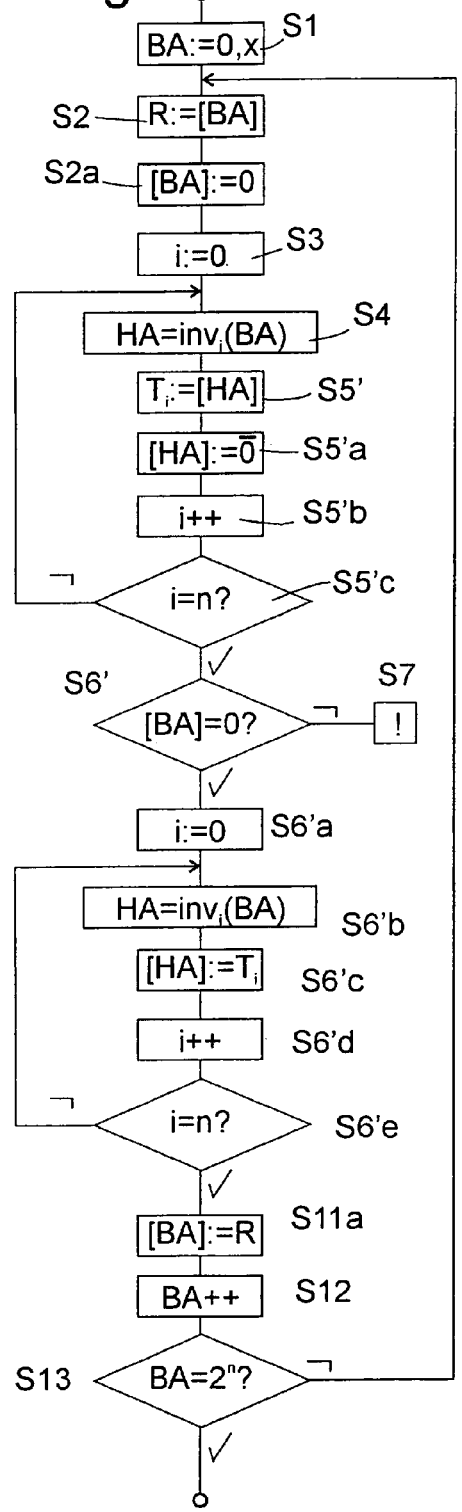

FIG. 6 shows a method that represents an accelerated variant of the method according to FIG. 5. Steps S1 to S5'a differ in the two methods only in that, according to FIG. 6, in S5' the content of Hamming address HA is backed up not to a single register T, but to one of n storage locations $T_1$. Step S5'a is followed by a step S5'b of incrementing continuous index i and S5'c of checking whether continuous index i has reached its upper limit n. If not, the method returns to step S4. If yes, the original contents of all n Hamming addresses HA belonging to base address BA are backed up to storage locations $T_0, \ldots, T_{n-1}$, and the Hamming addresses are overwritten with 1. Only at this point does checking S6' take place, as to whether the content of base address BA is still 0. That is, while the method according to FIG. 5 carries out step S6' for each Hamming address individually, this happens only once in the method according to FIG. 6, for all Hamming addresses of base addresses BA in common. Since an erroneous activation of base address BA can lead, in response to writing to Hamming address HA, only to the value 1 being entered at base address BA, there is no danger that an error will be overlooked; it can only no longer be stated which Hamming address HA it was that triggered the error.

If the checking of step S6' has not come up with an error, then, in a loop made up of steps S6'a to S6'e, the original content of the n Hamming addresses HA is recovered. There follow the same steps S11a, S12, S13 as in the method of FIG. 5. Just as was true there, each time the checking of a base address BA is closed with step S11a, an interruption of the method is possible.

The methods described above are also similarly applicable to the checking of column decoder 4, in this case the investigated base addresses in each case having the same, arbitrarily selected line part, and the column part being varied.

The methods described above are also applicable to an address decoder in which the partitioning of the address bits to line decoders and column decoders is not known. In this case, the record of the base addresses that are to be checked includes the entire address space of the data memory. The expenditure of time for carrying out a complete test is substantially higher, in this case, than for a data memory of known partitioning, because in the latter case the number of base addresses to be checked is only $2^m+2^n$, while in the former case $2^{n+m}$ addresses are to be investigated. But this only has an influence on the frequency with which the checking of the address decoder is able to take place.

What is claimed is:

1. A method for checking an address decoder of a data memory, comprising:
   selecting, one after another, each of a plurality of base addresses from a record of addresses of the data memory designated as the base addresses, so as to have a selected base address; and
   performing for the respectively selected base address the following:
   a) determining a content of a selected base address of the plurality of base addresses, so as to have a determined content of the selected base address,
   b) selecting an address having a Hamming distance 1 from the base address, designated as the Hamming address, so as to have a selected Hamming address,
   c) changing a content of the selected Hamming address,
   d) reading the base address and detecting an error of the address decoder if a content read from the selected base address differs from the determined content of the selected base address, and
   e) recovering the original content of the Hamming address.

2. The method as recited in claim 1, in which after the step e) there follows the step:
   f) reading the base address and detecting an error of the address decoder if the content read differs from that read in the step a).

3. The method as recited in claim 2, wherein the changing and the recovering of the content of the Hamming address takes place in each case by inverting.

4. The method as recited in claim 3, wherein the steps b) to f) are repeated for a plurality of the Hamming addresses assigned to the base address.

5. The method as recited in claim 1, wherein the changing of the content of the Hamming address takes place by backing up of an original content of the Hamming address and overwriting the Hamming address with a predetermined value, and the recovering takes place by a restore operation of the backed-up value to the Hamming address.

6. The method as recited in claim 5, wherein the step d) is carried out for the first time after an execution of the step c) and/or e) for a plurality of Hamming addresses.

7. The method as recited in claim 1, wherein the determining of the content of the base address is a reading of the base address.

8. The method as recited in claim 1, wherein the determining of the content of the base address is a backup of an original content of the base address and an overwriting of the base address with a predetermined value, and after carrying out the steps b) to e) for each Hamming address the original content of the base address is recovered.

9. The method as recited in claim 1, wherein the record of the base addresses includes all addresses in the address space of the data memory.

10. The method as recited in claim 1, wherein the addresses of the data memory are made up of a first and a second part, and the record of addresses includes every possible value of the first part at least once.

11. The method as recited in claim 1, wherein the method is executed by a program-controlled circuit.

12. The method as recited in claim 1, in which after the step e) there follows the step:
f) reading the base address and detecting an error of the address decoder if the content read differs from that read in the step a);
wherein the changing and the recovering of the content of the Hamming address takes place in each case by inverting,
wherein the steps b) to f) are repeated for a plurality of the Hamming addresses assigned to the base address.

13. The method as recited in claim 12, wherein the changing of the content of the Hamming address takes place by backing up of an original content of the Hamming address and overwriting the Hamming address with a predetermined value, and the recovering takes place by a restore operation of the backed-up value to the Hamming address, and wherein the step d) is carried out for the first time after an execution of the step c) and/or e) for a plurality of Hamming addresses.

14. The method as recited in claim 13, wherein the determining of the content of the base address is a reading of the base address.

15. The method as recited in claim 13, wherein the determining of the content of the base address is a backup of an original content of the base address and an overwriting of the base address with a predetermined value, and after carrying out the steps b) to e) for each Hamming address the original content of the base address is recovered.

16. The method as recited in claim 13, wherein the record of the base addresses includes all addresses in the address space of the data memory, and wherein the addresses of the data memory are made up of a first and a second part, and the record of addresses includes every possible value of the first part at least once.

17. A computer readable medium having a computer program, which is executable by a processor, comprising:
a program code arrangement having program code for enabling a program-controlled circuit to check an address decoder of a data memory, including:
selecting, one after another, each of a plurality of base addresses from a record of addresses of the data memory designated as the base addresses, so as to have a selected base address; and
performing for the respectively selected base address the following:
a) determining a content of a selected base address of the plurality of base addresses, so as to have a determined content of the selected base address,
b) selecting an address having a Hamming distance 1 from the base address, designated as the Hamming address, so as to have a selected Hamming address,
c) changing a content of the selected Hamming address,
d) reading the base address and detecting an error of the address decoder if a content read from the selected base address differs the determined content of the selected base address, and
e) recovering the original content of the Hamming address.

18. The computer readable medium as recited in claim 17, in which after the step e) there follows the step:
f) reading the base address and detecting an error of the address decoder if the content read differs from that read in the step a).

19. The computer readable medium as recited in claim 18, wherein the changing and the recovering of the content of the Hamming address takes place in each case by inverting.

20. The computer readable medium as recited in claim 19, wherein the steps b) to f) are repeated for a plurality of the Hamming addresses assigned to the base address.

21. The computer readable medium as recited in claim 17, wherein the changing of the content of the Hamming address takes place by backing up of an original content of the Hamming address and overwriting the Hamming address with a predetermined value, and the recovering takes place by a restore operation of the backed-up value to the Hamming address.

22. The computer readable medium as recited in claim 21, wherein the step d) is carried out for the first time after an execution of the step c) and/or e) for a plurality of Hamming addresses.

23. The computer readable medium as recited in claim 17, wherein the determining of the content of the base address is a reading of the base address.

24. The computer readable medium as recited in claim 17, wherein the determining of the content of the base address is a backup of an original content of the base address and an overwriting of the base address with a predetermined value, and after carrying out the steps b) to e) for each Hamming address the original content of the base address is recovered.

25. The computer readable medium as recited in claim 17, wherein the record of the base addresses includes all addresses in the address space of the data memory.

26. The computer readable medium as recited in claim 17, wherein the addresses of the data memory are made up of a first and a second part, and the record of addresses includes every possible value of the first part at least once.

27. The computer readable medium as recited in claim 17, in which after the step e) there follows the step:
f) reading the base address and detecting an error of the address decoder if the content read differs from that read in the step a);
wherein the changing and the recovering of the content of the Hamming address takes place in each case by inverting,
wherein the steps b) to f) are repeated for a plurality of the Hamming addresses assigned to the base address.

28. The computer readable medium as recited in claim 27, wherein the changing of the content of the Hamming address takes place by backing up of an original content of the Hamming address and overwriting the Hamming address with a predetermined value, and the recovering takes place by a restore operation of the backed-up value to the Hamming address, and wherein the step d) is carried out for the first time after an execution of the step c) and/or e) for a plurality of Hamming addresses.

29. The computer readable medium as recited in claim 28, wherein the determining of the content of the base address is a reading of the base address.

30. The computer readable medium as recited in claim 28, wherein the determining of the content of the base address is a backup of an original content of the base address and an overwriting of the base address with a predetermined value, and after carrying out the steps b) to e) for each Hamming address the original content of the base address is recovered.

31. The computer readable medium as recited in claim 28, wherein the record of the base addresses includes all addresses in the address space of the data memory, and wherein the addresses of the data memory are made up of a first and a second part, and the record of addresses includes every possible value of the first part at least once.

* * * * *